United States Patent
Li

(10) Patent No.: US 10,680,611 B2
(45) Date of Patent: Jun. 9, 2020

(54) KEY OF OPTICAL MECHANICAL KEYBOARD COMPRISING A RING LOCK WITH A LIGHT TRANSMISSION GROOVE AND A PHOTOELECTRIC SWITCH ON A CIRCUIT BOARD

(71) Applicant: Dongguan Mingjian Electronic Technology Co., Ltd., Guangdong (CN)

(72) Inventor: Jianping Li, Guangdong (CN)

( * ) Notice: Subject to any disclaimer, the term of this patent is extended or adjusted under 35 U.S.C. 154(b) by 82 days.

(21) Appl. No.: 16/079,567

(22) PCT Filed: Dec. 29, 2016

(86) PCT No.: PCT/CN2016/000718
§ 371 (c)(1),
(2) Date: Aug. 24, 2018

(87) PCT Pub. No.: WO2017/181313
PCT Pub. Date: Oct. 26, 2017

(65) Prior Publication Data
US 2019/0052266 A1 Feb. 14, 2019

(30) Foreign Application Priority Data
Apr. 21, 2016 (CN) .................... 2016 2 0345211 U

(51) Int. Cl.
*H01H 13/705* (2006.01)
*H03K 17/969* (2006.01)
*G01V 8/22* (2006.01)
*G01V 8/12* (2006.01)
*H01H 3/12* (2006.01)

(52) U.S. Cl.
CPC ............. *H03K 17/969* (2013.01); *G01V 8/12* (2013.01); *G01V 8/22* (2013.01); *H01H 3/125* (2013.01); *H01H 13/705* (2013.01); *H01H 2239/022* (2013.01)

(58) Field of Classification Search
CPC .......... G01V 8/12; G01V 8/22; H01H 13/705; H01H 2239/022; H03K 17/969
USPC .................................... 250/551, 239, 227.22
See application file for complete search history.

(56) References Cited

U.S. PATENT DOCUMENTS 9,838,006 B2 * 12/2017 Chen ...................... H03K 17/78

* cited by examiner

*Primary Examiner* — Que Tan Le
(74) *Attorney, Agent, or Firm* — Prakash Nama; Global IP Services, PLLC

(57) ABSTRACT

A key of an optical mechanical keyboard, having a base plate, a circuit board, an optical switch, a rotating member, a key cap, a pressing cylinder, a primary spring, and a secondary spring. A ring-shaped fastening member is provided on the base plate, and a side wall of the ring-shaped fastening member is provided with two opposing first light-admitting slots, and a keystroke impact slot is respectively provided at two sides of and between the opposing first light-admitting slots. The key has a simple structure and is lightweight and slim, and enables generation of a clear sound upon striking a key.

8 Claims, 4 Drawing Sheets

KEY OF OPTICAL MECHANICAL KEYBOARD COMPRISING A RING LOCK WITH A LIGHT TRANSMISSION GROOVE AND A PHOTOELECTRIC SWITCH ON A CIRCUIT BOARD

BACKGROUND OF THE INVENTION

This utility model is related to keyboard technical field, particularly to a assembly of photoelectric mechanical keyboard.

Mechanical keyboard is one type of keyboard, each key of which is provided with an individual switch to control close in the view of structure, which switch is also known "shaft", the keyboard can be classified into brown shaft, cyan shaft, white shaft, black shaft and red shaft according to the classification of the switch. It is just because each key includes an individual switch assembly, the key stage sense is more stronger, to produce special hand feel suitable for games, so as to be expensive high-end game peripherals and ideal devices of programmers.

When setting up mechanical keyboard, it is needed to setup a travel space for the "shaft" current mechanical keyboard is generally an up-and-down structure according to its shaft movement path, the movement path of the up-and-down structure is generally longer for achieving effect of stronger stage sense, so that the mechanical keyboard is formed thicker.

BRIEF SUMMARY OF THE INVENTION

This utility model provides a key assembly of photoelectric mechanical keyboard to avoid shortages of the prior art, which key assembly is simple in the structure, and produces obvious touch sound while pressing key, with stronger stage sense, so as to enhance tactile feel of the key.

A key assembly of photoelectric mechanical keyboard provided by this utility model comprises a motherboard, a circuit board, a photoelectric switch, a deflector, a key cap, a press shaft, a primary spring and a secondary spring; wherein ring lock is provided on the motherboard; the upper edge of the ring lock is provided with an impinge slot, and its lower edge is provided with a first light transmission groove; the circuit board is arranged on the motherboard, and the photoelectric switch is arranged on the circuit board; a swing arm extends radially from the upper end of the deflector; the lower edge of the deflector is provided with a second light transmission groove; the deflector is arranged in the ring lock, and the swing are is arranged at the upper edge of the ring lock; the key cap is arranged above the deflector, one end of the primary spring being connected with the motherboard, and another end being connected with the bottom of the key cap; one end of the secondary spring is connected with the deflector, and another end is connected with the bottom of the key cap, for actuating the deflector to strike the impinge slot; the bottom of the key cap is provided with a press shaft; a fold line type of chute is provided on the press shaft; when pressing/releasing the key cap, the deflector can slide along the fold line type of chute, for actuating the deflector to rotate in positive/negative direction, so as to enable the swing arm on the deflector to strike/leave from the impinge slot, meanwhile the first and second light transmission grooves are communicated or blocked, so that the optical path of the photoelectric switch is turned on/off, so as to achieve opening/closing of the keyboard assembly.

Preferably, two opposite first light transmission grooves are provided on the sidewall of the ring lock, and an impinge slot is provided each between the two opposite first light transmission grooves; the depth of the first light transmission groove is larger than the depth of the second light transmission groove;

the circuit board is arranged on the motherboard; an indentation is provided at the place where the circuit board and the ring lock are opposite, enabling the ring lock to pass through the indentation upward; the photoelectric switch is mounted on the circuit board; the optical signal of the photoelectric can propagate along the path of between the two opposite first light transmission grooves;

the deflector is arranged in the ring lock; the upper end of the deflector extends radially from the two opposite swing arm; the swing arm is arranged at the upper edge of the ring lock; a second light transmission groove is pro provided at the lower end of the sidewall of the deflector; a bearing is provided along the inner sidewall of the deflector;

the key cap and the motherboard are connected through a compressible connection piece; the key cap is arranged above the deflector; the press shaft is arranged at the bottom of the key cap, and opposite to the deflector; the two opposite sidewall of the press shaft are each provided with a fold line type of chute; the fold line type of chute is consisted of a first, second and third chutes connected with each other; the intersection angle between the first and second chutes is an obtuse angle, the intersection angle between the second and third chutes being an obtuse angle; the swing arm of the deflector is arranged in the first chute;

the primary spring is telescoped outside of the ring lock and the press shaft; one end of the primary spring is connected with the motherboard, and another end is connected with the bottom of the key cap; the secondary spring is arranged in the deflector; one end of the secondary spring is connected with the bearing, and another end is connected with the bottom of the key cap;

when the key cap is in released state, the two swing arms are arranged at the upper edge of the ring lock; and positioned in the first chutes respectively; the first light transmission groove is opposite to the second light transmission groove; the optical path between the photoelectric aches is turned on; the primary spring supports the key cap;

when the key cap is pressed, the primary and secondary springs are compressed, the swing arm slides in from the first chute into the second and third chutes, and actuates the deflector to rotate in the positive direction; when the swing arm slides into the third chute, the swing arm is opposite to the impinge slot, and the secondary spring is reset, so that the swing arm moves downward instantly and strikes the slot wall upper end of the impinge slot; meanwhile the first light transmission groove is staggered from the second light transmission groove, so that the optical path of the photoelectric is switch is blocked;

when the key cap is released from the pressed state, the primary spring ejects the key cap; the two swing arms slide respectively from the third chute into the second and first chutes, so as to enable the swing arms to leave the impinge slot, and to actuate the deflector to rotate in the negative direction; the swing arms are arranged again at the upper end of the ring lock; the optical path of the photoelectric switch is recovered.

Preferably the compressible connection piece is a X type of support, which includes a main frame, a first hinge pole and a second hinge pole; the main frame includes a left brace and right brace, and there is connected a first transversal connection piece between the left and right braces; the first hinge pole is hinged to the left brace, and its lower end extends from the underside of the first transversal connection piece; the second hinge pole is hinged to the right brace; and its lower end extends from the underside of the first transversal connection piece; the main frame is connected with the motherboard; the lower end of the first hinge pole is connected with the motherboard, and its upper end is connected with the bottom of the key cap; the lower end of the second hinge pole is connected with the motherboard, and its upper end is connected with the bottom of the key cap.

Preferably, there is provided a second transversal connection piece between the first and second hinge poles.

Preferably, the first and third chutes are vertical chutes.

Preferably, a first bulge is provided in the press shaft, the outer wall of which matches with the inner wall of the secondary spring; one end of the secondary spring is telescoped outside of the first bulge, and another end is connected with the bottom of the key cap.

Preferably, a second bulge is provided on the motherboard, which is a column ring surrounding the ring lock; the outer wall of the bulge matching with the inner wall of the primary spring; one end of the primary spring is telescoped outside of the second bulge, and another end is connected with the bottom of the key cap.

Preferably, it further comprises a circuit board protection layer, which is arranged on the circuit board.

The technical solution provided by this utility model can include the following beneficial effects:

(1) The key assembly of photoelectric mechanical keyboard provided by this utility model achieves opening and closing of the key through interaction of the press shaft, deflector and ring lock. Because of setting-up of the deflector, the travel of the shaft up-and-down movement can be reduced to some extent, so as to make the final keyboard lighter and thinner. Furthermore, response is sensitive through the control of key opening and closing by photoelectric switch. The key assembly is simpler in the structure, and the deflector may rotate synchronously while the key cap is pressed, the s ng arm shifts instantly, meanwhile strikes the impinge slot on the ring lock to produce sound, and is capable of producing obvious touch sound at the time of pressing key, so as enhance tactile feel of the key.

(2) The key assembly of photoelectric mechanical keyboard provided by this utility model makes connection between the motherboard and the key cap through a compressible X type of support, wherein the X type of support is in folded status when the key cap is pressed; and the X type of support is recovered to opening status with elastic force of the primary spring when the key cap is released. The X type of support makes connection between the motherboard and the key cap more stabile, so as to prevent the key from unbalanced status during the use of it.

(3) The key assembly of photoelectric mechanical keyboard provided by this utility model, wherein one end of the secondary spring is telescoped on the outer wall of the first bulge, while one end of the primary spring is telescoped on the enter wall of the second bulge, so that the primary and secondary springs are aligned more accurately, not easy to be shift.

Reference number in the Figures: 10 motherboard; 11 ring lock; 12 first light transmission groove; 13 impinge slot; 20 circuit board: 21 photoelectric switch; 30 key cap; 31 press shaft; 32 fold line type of chute; 33 first bulge; 40 deflector: 41 swing arm, 50 primary spring: 60 secondary spring; 70 X type of support; 71 right brace; 72 left brace; 73 first transversal connection piece; 74 second hinge pole; 75 first hinge pole.

The appended figures herein are included in the description and constitute a part of this description, illustrate embodiments of this utility model, and are used to explain the principle of this utility model with this description.

DETAILED DESCRIPTION OF THE INVENTION

In the following, this utility model is described further in details through particular embodiments with reference to the appended figures.

Figure 1:
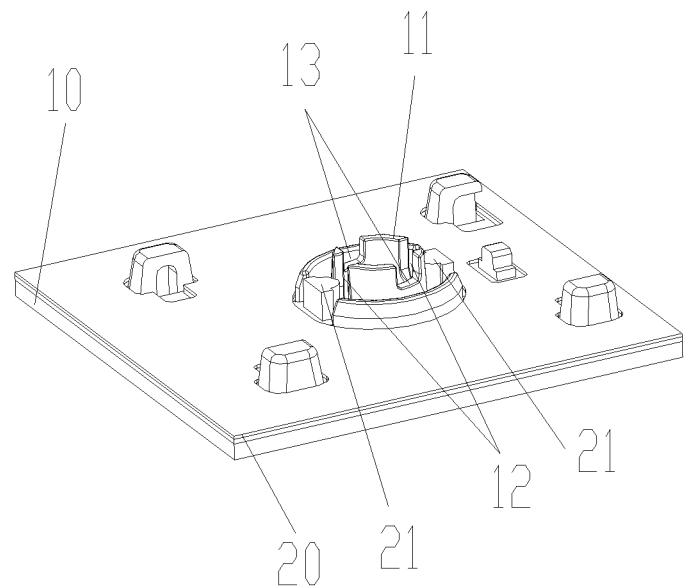
FIG. 1 is a matching schematic view of the motherboard and the circuit board in the key assembly of photoelectric mechanical keyboard provided by an embodiment of this utility model.
Figure 2:
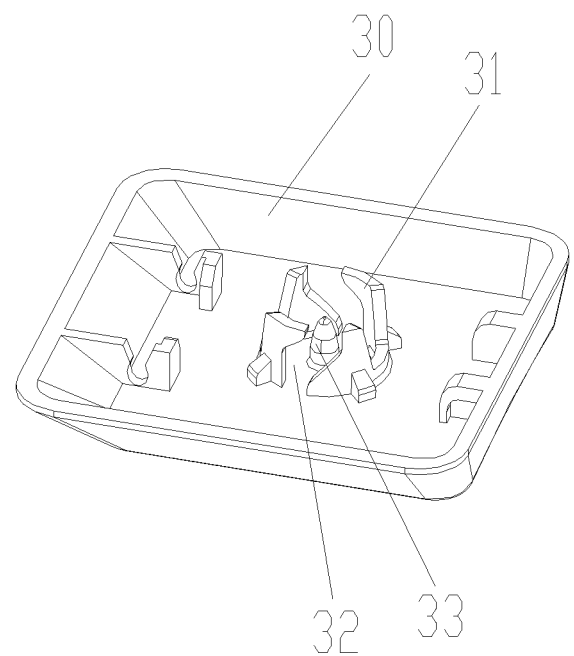
FIG. 2 is a schematic view of the key cap in the key assembly of photoelectric mechanical keyboard provided by an embodiment of this utility model.
Figure 3:
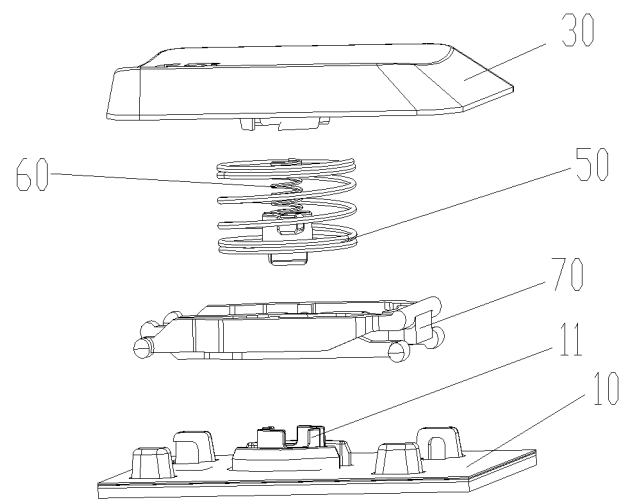
FIG. 3 is n exploded view of the key assembly of photoelectric mechanical keyboard provided by an embodiment of this utility model.
Figure 4:
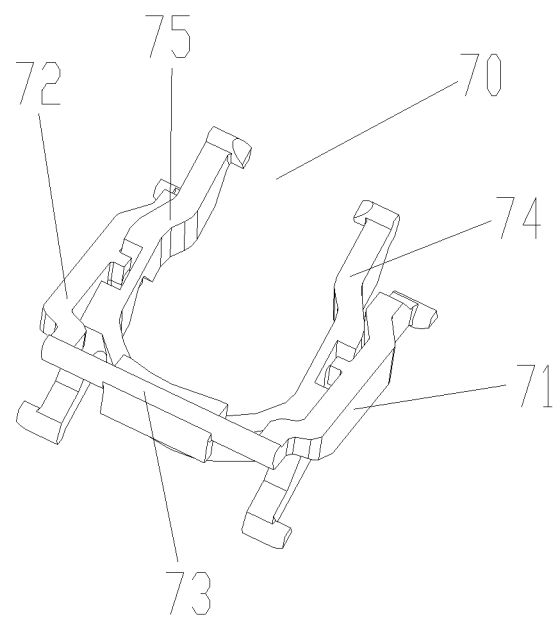
FIG. 4 is a schematic view of the X type of support in the key assembly of photoelectric mechanical keyboard provided by an embodiment of this utility model.
Figure 5:
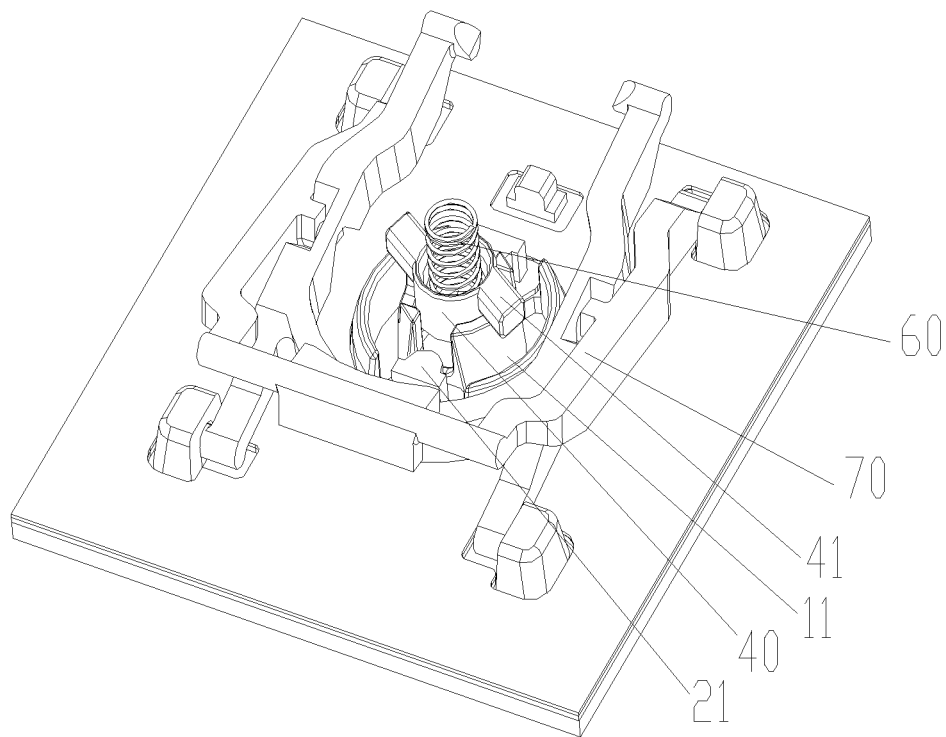
FIG. 5 is a matching schematic view of the deflector and the lock while releasing the key cap in the key assembly of photoelectric mechanical keyboard provided by an embodiment of this utility model.
Figure 6:
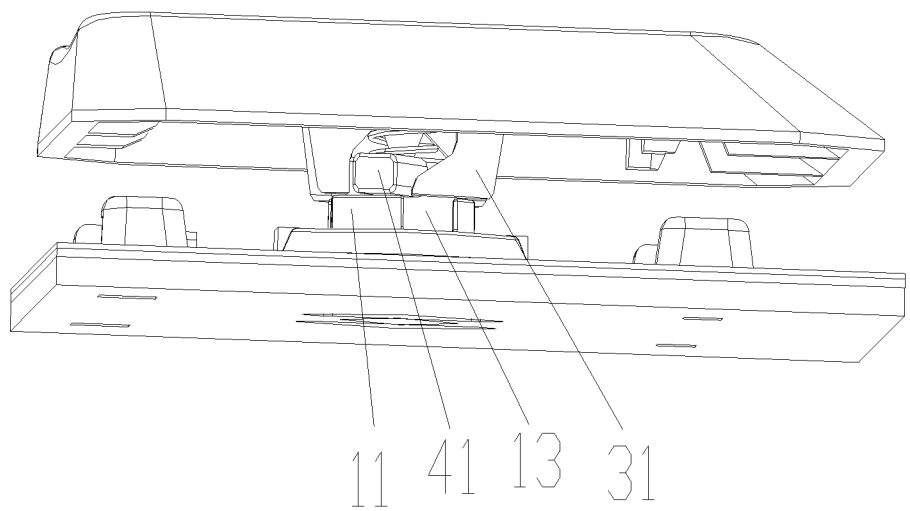
FIG. 6 is a matching schematic view of the deflector and the press shaft while releasing the key cap in the key assembly of photoelectric mechanical keyboard provided by an embodiment of this utility model.
Figure 7:
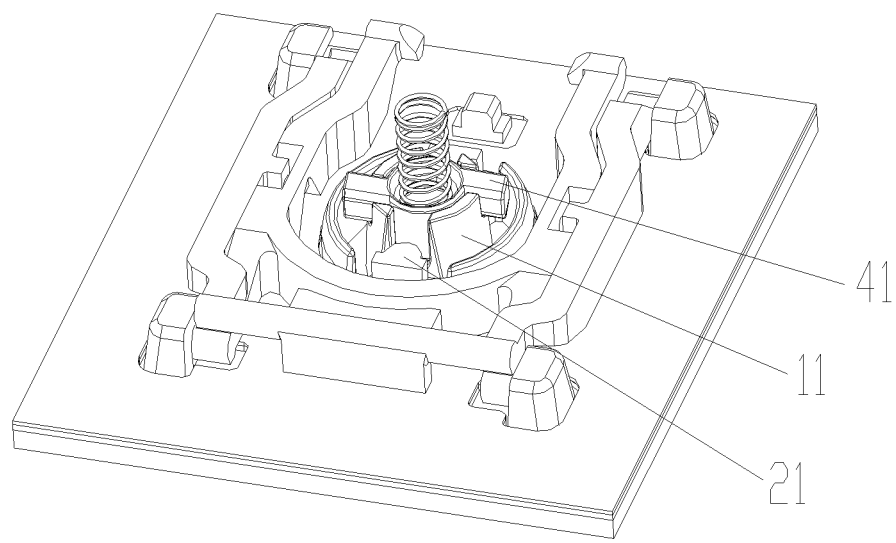
FIG. 7 is a matching schematic view of the deflector and the lock while pressing the key cap in the key assembly of photoelectric mechanical keyboard provided by an embodiment of this utility model.

As shown in FIGS. 1-7, a key assembly of photoelectric mechanical keyboard comprise a motherboard 10, a circuit board 20, a photoelectric switch 21, a deflector 40, a key cap 30, a press shaft 31, a primary spring 50 and a secondary spring 60; Therein a ring lock 11 is arranged on the motherboard 10, two opposite first light transmission grooves 12 being arranged on the sidewalls of the ring lock 11, and an impinge slot 13 being arranged between each of the two opposite first light transmission grooves 12; the depth of the first light transmission groove 12 is larger than the impinge slot 13; the circuit board 20 being arranged on the motherboard 10; there is provided an indentation at the place where the circuit board 20 and the ring lock 11 are opposite, enabling the ring lock 11 to pass through the indentation upward; the photoelectric switch 21 is mounted on the circuit board 21; the optical signal of the photoelectric switch 21 can propagate along the path between the two opposite first light transmission grooves 12; the deflector 40 is arranged in the ring lock 11; two opposite swing arms 41 radially extend the upper end of the deflector 40; second light transmission grooves are provided at the lower end of the sidewalls of the deflector 40; the swing arm 41 is arranged at the upper edge of the ring lock 11; a second light transmission groove is provided at the lower end of the sidewall of the deflector 40; a bearing is provided along the inner sidewall of the deflector 40; the key cap 30 and the motherboard 10 are connected through a compressible connection piece; the key cap 30 being arranged above the deflector 40 the press shaft 31 is arranged at the bottom of the key cap 30, and opposite to the deflector 40; the two opposite sidewall of the press shaft 31 are each provided with a fold line type of chute 32; the fold line type of chute 32 is consisted of a first, second and third chutes connected with each other; the intersection angle between the first and second chutes is an obtuse angle, the intersection angle between the second and third chutes being an obtuse angle; the swing arm 41 of the deflector 40 is arranged in the first chute; the primary spring 50 is telescoped outside of the ring lock 11 and press shaft 31; one end of the primary spring 50 is connected with the motherboard 10, and another end is connected with the bottom of the key cap 30; the secondary spring 60 is arranged in the deflector 40; one end of the secondary spring 60 is connected with the bearing, and another end is connected with the bottom of the key cap 30.

In the following, a way of setting up the compressible connection piece is further described in detail. The compressible connection piece is a X type of support 70, which includes a main frame a first hinge pole 75 and a second hinge pole 74; the main frame includes a left brace 72 and a right brace 71, and there is connected a first transversal connection piece 73 between the left brace 72 and right brace 71; the first hinge pole 75 is hinged to the left brace 72, and its lower end extends from the underside of the first transversal connection piece 73; the second hinge pole 74 is hinged to the right brace 71; and its lower end extends from the underside of the first transversal connection piece 73; the main frame is connected with the motherboard 10; the lower end of the first hinge pole 75 is connected with the motherboard 10, and its upper end is connected with the bottom of the key cap 30; the lower end of the second hinge pole 74 is connected with the motherboard 10, and its upper end is connected with the bottom of the key cap 30. There is provided a second transversal connection piece between the first hinge pole 75 and the second hinge pole 74.

Preferably, the first and third chutes are vertical chutes.

In order for the primary and secondary springs to be aligned more accurately, not easy to be shift, first bulge 33 can be provided in the press shaft 31, the outer wall of the first bulge 33 matching with the inner wall of the secondary spring 60, one end of the secondary spring 60 being telescoped on the outer wall of the first bulge 33. A second bulge can be provided on the motherboard 10, which is a column ring surrounding the ring lock 11; the outer wall of the second bulge matches with the inner wall of the primary spring 50, and one end of the primary spring 50 is telescoped outside of the second bulge.

In order to protect the circuit board 20 better, there can be provided a circuit board protection layer on the circuit board 20.

The following is the function principle of the key assembly of photoelectric mechanical keyboard of embodiments of this utility model:

When the key cap 30 is in released status, the two swing arms 41 are arranged on the upper edge of the ring lock 11, and respectively situated in the first chute; the first light transmission groove 12 is opposite to the second light transmission groove, the path between the photoelectric switch 21 is turned on; the primary spring 50 supports the key cap 30;

When the key cap 30 is pressed, the primary spring 50 and secondary spring 60 are compressed, the swing arm 41 slides in turn from the first chute into the second and third chutes, and actuates the deflector 40 to rotate in the positive direction when the swing arm 41 slides into the third chute, the swing arm 41 is opposite to the impinge slot 13, and the secondary spring 60 is reset, so that the swing arm 41 moves downward instantly and strikes the slot wall upper end of the impinge slot 13; meanwhile, the first light transmission groove 12 is staggered from the second light transmission groove, so that the optical path of the photoelectric switch 21 is blocked;

When the key cap 30 is released from the pressed state, the primary spring 50 ejects the key cap 30; the two swing am 41 slide respectively from the third chute into the second and first chutes, so as to enable the swing arms 41 to leave from the impinge slot 13, and to actuate the deflector 40 to rotate in the negative direction; the swing arms 41 are arranged again at the upper end of the ring lock 11; the optical path of the photoelectric switch 21 is recovered.

According to the technical solution and conception described above, those skilled in the art may make variant respective changes and modifications which all fall into the protection range claimed by this utility model.

What is claimed is:

1. A key of photoelectric mechanical keyboard, comprising a motherboard, a circuit board, a photoelectric switch, a deflector, a key cap, a press shaft, a primary spring and a secondary spring;
    a ring lock is provided on the motherboard; an impinge slot is provided on the upper edge of the ring lock, and a first light transmission groove is provided on the lower edge of the ring lock;
    the circuit board is arranged on the motherboard, on which circuit board there is provided the photoelectric switch;
    swing arms are provided extending radially from the upper end of the deflector; a second light transmission groove is provided on the lower edge of the deflector; the deflector is arranged in the ring lock, and the swing arms are arranged on the upper edge of the ring lock;
    the key cap is arranged above the deflector, one end of the primary spring is connected with the motherboard, and the other end is connected with the bottom of the key cap;
    one end of the secondary spring is connected with the deflector, and another end is connected with the bottom of the key cap for actuating the deflector to strike the impinge slot;
    a press shaft is provided on the bottom of the key cap; a fold line type of chute is provided on the press shaft;
    when pressing/releasing the key cap, the deflector can slide along the fold line type of chute, to actuate the deflector rotating in a positive/negative direction, so as to enable the swing arms on the deflector to strike/leave from the impinge slot; meanwhile, the first and second light transmission grooves are connected/blocked, so that the optical path of the photoelectric switch is turned on/off, so as to achieve the turning on/off of the keyboard assembly.

2. The key of the photoelectric mechanical keyboard according to claim 1, wherein two opposite first light transmission grooves are arranged on the sidewalls of the ring lock, the impinge slot is provided each between the opposite first light transmission grooves; the depth of the first light transmission groove is larger than the depth of the impinge slot;
    the circuit board is arranged on the motherboard; an indentation is provided at the place where the circuit board and the ring lock are opposite, enabling the ring lock to up through the indentation; the photoelectric switch is mounted on the circuit board; the optical signal of the photoelectric switch can propagate along the path of between the opposite first light transmission grooves;

the deflector is arranged in the ring lock; the upper end of the deflector extends radially out the swing arms, and the swing arms are oppositely arranged; the swing arms are arranged at the upper edge of the ring lock; a second light transmission groove is provided at the lower end of the sidewall of the deflector, a bearing is provided along the inner sidewall of the deflector;

the key cap and the motherboard are connected through a compressible connection piece; the key cap is arranged above the deflector; the press shaft is arranged at the bottom of the key cap, and opposite to the deflector; the opposite sidewall of the press shaft are each provided with a fold line type of chute; the fold line type of chute is consisted of a first chute, a second chute and a third chute connected with each other; the intersection angle between the first chute and second chute is an obtuse angle, the intersection angle between the second chute and third chute being an obtuse angle; the swing arm of the deflector is arranged in the first chute;

the primary spring is telescoped outside of the ring lock and the press shaft; one end of the primary spring is connected with the motherboard, and another end is connected with the bottom of the key cap; the secondary spring is arranged in the deflector; one end of the secondary spring is connected with the bearing, and another end is connected with the bottom of the key cap;

when the key cap is in released state, the swing arms are arranged at the upper edge of the ring lock; and positioned in the first chute respectively; the first light transmission groove is opposite to the second light transmission groove; the optical path between the photoelectric switches is turned on; the primary spring supports the key cap;

when the key cap is pressed, the primary and secondary springs are compressed, the swing arms slides in turn from the first chute into the second chute and the third chute, and actuates the deflector to rotate in the positive direction; when the swing arms slide into the third chute, the swing arms are opposite to the impinge slot, and the secondary spring is reset, so that the swing arms move downward instantly and strikes the slot wall upper end of the impinge slot; meanwhile, the first light transmission groove is staggered from the second light transmission groove, so that the optical path of the photoelectric switch is blocked;

when the key cap is released from the pressed state, the primary spring ejects the key cap; the swing arms slide respectively from the third chute into the second chute and the first chute, so as to enable the swing arms to leave from the impinge slot, and to actuate the deflector to rotate in the negative direction; the swing arms are arranged again at the upper end of the ring lock; the optical path of the photoelectric switch is recovered.

3. The key of the photoelectric mechanical keyboard according to claim 2, wherein the compressible connection piece is a X type of support, which includes a main frame, a first hinge pole and second hinge pole; the main frame includes a left brace and a right brace, and there is connected a first transversal connection piece between the left and right braces; the first hinge pole is hinged to the left brace, and a lower end of the first hinge pole extends from the underside of the first transversal connection piece; the second hinge pole is hinged to the right brace; and a lower end of the second hinge pole extends from the underside of the first transversal connection piece;

the main frame is connected with the motherboard; the lower end of the first hinge pole is connected with the motherboard, and an upper end of the first hinge pole is connected with the bottom of the key cap; the lower end of the second hinge pole is connected with the motherboard, and an upper end of the second hinge pole is connected with the bottom of the key cap.

4. The key of the photoelectric mechanical keyboard according to claim 3, wherein there is provided a second transversal connection piece between the first and second hinge poles.

5. The key of the photoelectric mechanical keyboard according to claim 2, wherein each of the first chute and the third chute are vertical chutes.

6. The key of the photoelectric mechanical keyboard according to claim 1, wherein a first bulge is provided in the press shaft, the outer wall of which matches with the inner wall of the secondary spring; one end of the secondary spring is telescoped outside of the first bulge, and another end is connected with the bottom of the key cap.

7. The key of the photoelectric mechanical keyboard according to claim 1, wherein a second bulge is provided on the motherboard, which is a column ring surrounding the ring lock; the outer wall of the bulge matching with the inner wall of the primary spring; one end of the primary spring is telescoped outside of the second bulge, and another end is connected with the bottom of the key cap.

8. The key of the photoelectric mechanical keyboard according to claim 1, further comprising a circuit board protection layer, which is arranged on the circuit board.

* * * * *